US008971139B2

(12) United States Patent
Kajigaya (10) Patent No.: US 8,971,139 B2
(45) Date of Patent: Mar. 3, 2015

(54) SEMICONDUCTOR DEVICE AND DATA PROCESSING SYSTEM

(75) Inventor: Kazuhiko Kajigaya, Tokyo (JP)

(73) Assignee: PS4 Luxco S.A.R.L., Luxembourg (LU)

( * ) Notice: Subject to any disclaimer, the term of this patent is extended or adjusted under 35 U.S.C. 154(b) by 410 days.

(21) Appl. No.: 13/067,551

(22) Filed: Jun. 8, 2011

(65) Prior Publication Data

US 2011/0305097 A1    Dec. 15, 2011

(30) Foreign Application Priority Data

Jun. 9, 2010    (JP) .................................. 2010-132505

(51) Int. Cl.
*G11C 7/00*    (2006.01)
*G11C 11/4097*    (2006.01)
*G11C 8/06*    (2006.01)
*G11C 11/4094*    (2006.01)

(52) U.S. Cl.
CPC .............. *G11C 11/4097* (2013.01); *G11C 8/06* (2013.01); *G11C 11/4094* (2013.01); *G11C 2207/002* (2013.01); *G11C 2207/005* (2013.01)
USPC .................. 365/202; 365/189.15; 365/189.17; 365/189.08; 365/198; 365/230.03

(58) Field of Classification Search
USPC ........... 365/189.011, 189.15, 189.18, 189.08, 365/198, 202, 230.03
See application file for complete search history.

(56) References Cited

U.S. PATENT DOCUMENTS

| 5,337,271 | A | 8/1994 | Kawahara et al. | |
|---|---|---|---|---|
| 5,694,445 | A | 12/1997 | Hirano et al. | |
| 6,061,278 | A * | 5/2000 | Kato et al. | 365/190 |
| 6,215,692 | B1 * | 4/2001 | Kang | 365/145 |
| 6,285,576 | B1 * | 9/2001 | Kang | 365/145 |
| 6,925,022 | B2 * | 8/2005 | Arimoto et al. | 365/222 |
| 6,937,535 | B2 * | 8/2005 | Ahn et al. | 365/222 |
| 7,333,378 | B2 | 2/2008 | Sim | |
| 7,339,833 | B2 * | 3/2008 | Jono et al. | 365/185.25 |
| 7,719,905 | B2 * | 5/2010 | Kang et al. | 365/196 |
| 2004/0052146 | A1 | 3/2004 | Sim | |

FOREIGN PATENT DOCUMENTS

| JP | 5-135580 | A | 6/1993 |
|---|---|---|---|
| JP | 7-141877 | A | 6/1995 |
| JP | 8-147969 | A | 6/1996 |
| JP | 8-249885 | A | 9/1996 |
| JP | 10-149683 | A | 6/1998 |
| JP | 2004-134058 | A | 4/2004 |

* cited by examiner

*Primary Examiner* — Vanthu Nguyen
(74) *Attorney, Agent, or Firm* — McGinn IP Law Group, PLLC (57) ABSTRACT

A semiconductor device comprises transmission lines, inverting circuits, first, second and third switches, global sense amplifiers, and a control circuit. The first switch switches between the transmission line and the input of the inverting circuit, the second switch switches between the transmission line and the output of the transmission line, and the third switch switches between the adjacent transmission lines. The control circuit turns off the first and second switches so that the transmission lines are brought into a floating state in a state where signals of the transmission lines are held in the inverting circuits by the global sense amplifiers. After charge sharing of the transmission lines occurs by turning on the third switches within a predetermined period, the control circuit turns off the second switches so that the transmission lines are inverted and driven via the inverting circuits and the second switches.

12 Claims, 12 Drawing Sheets

SEMICONDUCTOR DEVICE AND DATA PROCESSING SYSTEM

BACKGROUND OF THE INVENTION

1. Field of the Invention

The present invention relates to a semiconductor device having a plurality of transmission lines that transmit data, and particular relates to a semiconductor device having a configuration in which electric charge stored in each of the transmission lines is reused.

2. Description of Related Art

Generally, in order to achieve lower power consumption in a semiconductor device such as DRAM, it is required to reduce charge/discharge current flowing when signals are transmitted through transmission lines such as a plurality of bit lines arranged in a memory cell array. Therefore, techniques for reducing the charge/discharge current by reusing electric charge stored in the transmission lines have been conventionally proposed. For example, Patent Reference 1 discloses a technique in which first and second common source lines for driving a sense amplifier of DRAM are short-circuited by a switch between both the common source lines so that electric charge of the first common source line that has been stored during a precedent sensing operation is reused for driving the second common source line during a subsequent sensing operation. For example, Patent References 2 and 3 disclose a charge reusing technique that can be applied to a refresh operation for memory cell arrays of the same type. For example, Patent Reference 4 discloses a charge reusing technique that can be utilized in randomly accessing the memory cell array. For example, Patent References 5 and 6 disclose a technique in which electric charge stored in parasitic capacitances of signal lines controlling the memory cell array is reused therebetween.

[Patent Reference 1] Japanese Patent Application Laid-open No. 5-135580 (U.S. Pat. No. 5,337,271)
[Patent Reference 2] Japanese Patent Application Laid-open No. 7-141877
[Patent Reference 3] Japanese Patent Application Laid-open No. 8-147969 (U.S. Pat. No. 5,694,445)
[Patent Reference 4] Japanese Patent Application Laid-open No. 8-249885
[Patent Reference 5] Japanese Patent Application Laid-open No. 10-149683
[Patent Reference 6] Japanese Patent Application Laid-open No. 2004-134058 (U.S. Pub. No. 2004-0052146)

However, a configuration having a memory cell array in which bit lines and sense amplifiers are hierarchized has been proposed with an increase in capacity of semiconductor memory devices such as DRAM. Generally, a hierarchical memory cell array is hierarchized into local bit lines of a lower hierarchy and global bit lines of an upper hierarchy, and thereby the number of memory cells connected to each local bit line can be suppressed so as to reduce influence of the parasitic capacitances and the like. In such a configuration, particularly when employing a single-ended structure for the bit line and the sense amplifier, it is required to reduce consumption current when data of each memory cell is inverted and readout through the local bit line and the global bit line and thereafter the data is re-inverted and restored to the memory cell by a global sense amplifier or the like.

However, the technique of the Patent Reference 1 is applied to a continuous refresh operation, and cannot be applied to reduce the consumption current when inverting and driving the data of the global bit line in the hierarchical memory cell array. The techniques of the Patent References 2, 3 and 4 have a problem of an increase in area for arranging a capacitor having a large capacitance that stores the electric charge to be reused or a large number of capacitors. The technique of the Patent Reference 5 is applied to an operation in which one signal line selected from a plurality of signal lines is selectively driven, and cannot be applied to reduce the consumption current when inverting and driving the data of the global bit line in the hierarchical memory cell array. The technique of the Patent Reference 6 is applied to an operation in which, when discharging electric charge of one signal line to be driven first, another signal line to be driven subsequently is charged, and cannot be applied to reduce the consumption current when inverting and driving the data of the global bit line in the hierarchical memory cell array. In this manner, according to charge reusing techniques applicable in the conventional semiconductor devices, methods effective for suppressing the consumption current in a restore operation in the hierarchical memory cell array have not been proposed yet.

SUMMARY

One of aspects of the invention is a semiconductor device comprising: a semiconductor device comprising: a plurality of transmission lines each transmitting a binary logic signal; a plurality of inverting circuits each inverting a logic of the signal being received and outputting an inverted signal; a plurality of first switches each controlling an electrical connection between the transmission line and an input side of the inverting circuit; a plurality of second switches each controlling an electrical connection between the transmission line and an output side of the inverting circuit; a plurality of third switches each controlling an electrical connection between the transmission lines that are adjacent to each other; a plurality of global sense amplifiers; and a control circuit, wherein the control circuit sets the plurality of the first and second switches into a non-conductive state so that the plurality of transmission lines are brought into a floating state respectively in a state where signals of the plurality of transmission lines are held in the plurality of inverting circuits by the global sense amplifiers via corresponding ones of the plurality of first switches, and after charge sharing of adjacent ones of the plurality transmission lines occurs by setting the plurality of the third switches into a conductive state within a predetermined period, the control circuit sets the second switches into a conductive state so that the plurality of transmission lines are inverted and driven via corresponding ones of the plurality of inverting circuits and second switches.

According to the semiconductor device of the invention, prior to inverting and driving signals of the plurality of transmission lines of the semiconductor device, adjacent transmission lines are short-circuited so that charge sharing therebetween occurs or they become to have the same potential after the transmission lines are brought into a floating state, and then the transmission lines are inverted and driven by the inverting circuits that preliminarily store the signals. Thus, when the adjacent transmission lines are inverted and driven with signals having logics opposite to each other, the adjacent lines are short-circuited so that electric charge transfers between fixed capacitances thereof, thereby facilitating effective reuse of the electric charge to reduce consumption current. The present invention can be applied, for example, to a memory cell array that is hierarchized into a global bit line and a predetermined number of local bit lines, and thereby it is possible to obtain a sufficient reduction effect of the consumption current required for a driving operation.

As described above, according to the present invention, in a semiconductor device having a large number of transmission lines, when driving adjacent transmission lines in directions opposite to each other, the respective transmission lines in a floating state are short-circuited so that the electric charge of fixed capacitances of the transmission lines can be reused, thereby obtaining an effect of reducing the consumption current in the driving operation. At this point, if the adjacent transmission lines are driven in the same direction as each other, the coupling capacitance between the adjacent transmission lines does not serve as a wiring load, and thus the consumption current can be reduced without reusing the electric charge. In the semiconductor device of the invention, the degree of the current reduction effect changes in accordance with a ratio of the transmission lines having logics opposite to each other. When a ratio of the fixed capacitance and the coupling capacitance in each transmission line approximately matches 4:1, the reduction effect of consumption current can be optimized without depending on the ratio of the transmission lines having logics opposite to each other.

BRIEF DESCRIPTION OF THE DRAWINGS

The above featured and advantages of the present invention will be more apparent from the following description of certain preferred embodiments taken in conjunction with the accompanying drawings, in which.

DETAILED DESCRIPTION OF THE PREFERRED EMBODIMENTS

A typical example of a technical idea solving the problems of the present invention will be shown below. However, it goes without saying that the present invention is not limited to the example of the technical idea and should be construed based on the disclosure of the claims.

Figure 1:
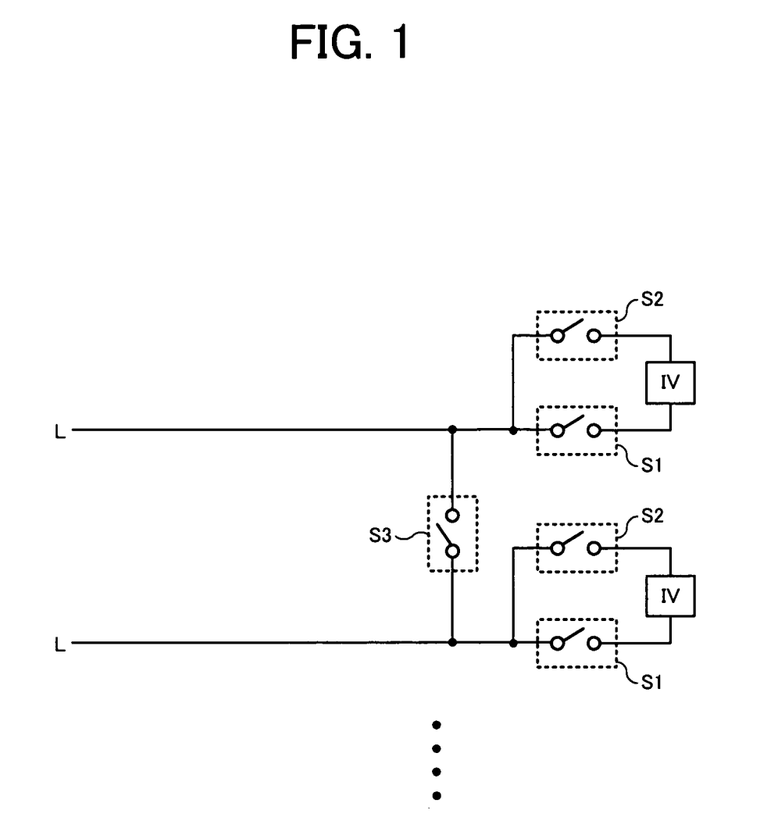
FIG. 1 is a principle diagram showing a technical idea of the invention.

As shown in FIG. 1, an example of the technical idea of the invention is applied to a semiconductor device having a plurality of transmission lines L, in which each transmission line L is of a single-ended type (single phase) that transmits a binary logic signal through one signal line. The semiconductor device of FIG. 1 includes switches S1, S2 and an inverting circuit IV that are attached to each transmission line L, and a switch S3 between adjacent transmission lines L. Then, in a state where the signal of each transmission line L is stored in the inverting circuit IV via the switch S1, the transmission line L is brought into a floating state by setting the switches S1 and S2 to a non-conductive state, the adjacent transmission lines L are short-circuited so that charge sharing occurs or preferably the lines change to approximately the same potential by setting the switch S3 to a conductive state within a certain period of time, and thereafter each transmission line L is inverted and driven via the inverting circuit IV and the switch S2. Thus, when signals having opposite logics are inverted and driven through the adjacent two transmission lines L in FIG. 1, it is possible to effectively reuse the electric charge between fixed capacitances of the lines, and thereby consumption current can be sufficiently reduced when inverting and driving the transmission lines L.

Preferred embodiments of the invention will be described in detail below with reference to accompanying drawings. In the following embodiments, the present invention is applied to a DRAM (Dynamic Random Access Memory) as an example of the semiconductor device.

Figure 2:
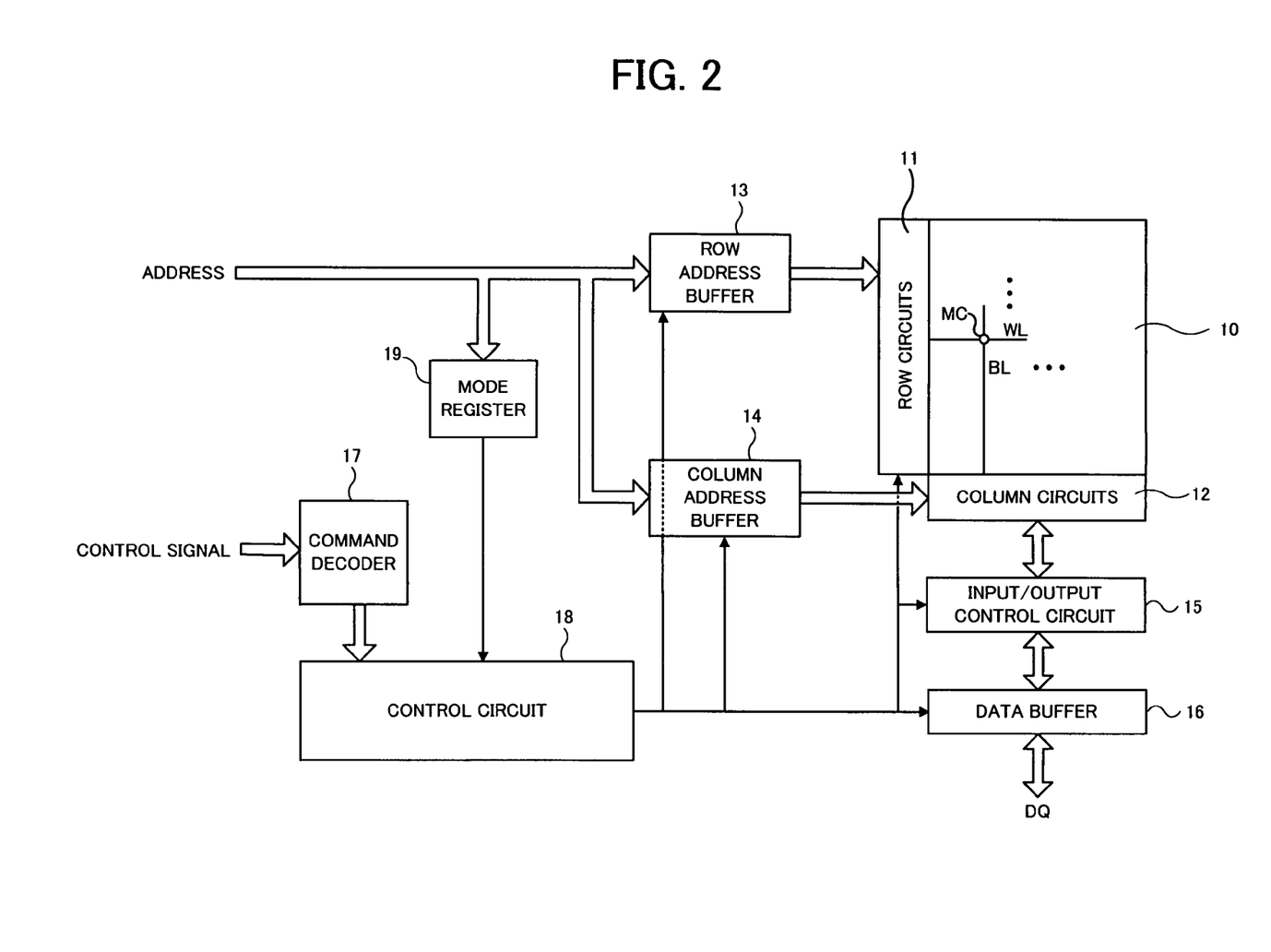
FIG. 2 is a block diagram showing an entire configuration of a DRAM of an embodiment.

FIG. 2 is a block diagram showing an entire configuration of the DRAM of an embodiment. The DRAM shown in FIG. 2 includes a memory cell array 10 having a plurality of memory cells MC arranged at intersections of a plurality of word lines WL and a plurality of bit lines BL, and row circuits 11 and column circuits 12 that are attached to the memory cell array 10. The row circuits 11 includes a large number of circuits provided corresponding to the plurality of word lines WL, and the column circuits 12 includes a large number of circuits provided corresponding to the plurality of bit lines BL. In addition, since a hierarchical bit line structure is employed in the embodiment, each bit line BL of the memory cell array 10 is hierarchized into a global bit line GBL of an upper hierarchy and local bit lines LBL of a lower hierarchy, as described later. Also, the row circuits 11 includes a control circuit that controls the above-mentioned switches S1, S2, S3 and the inverting circuit IV, respectively.

Externally input addresses includes a row address and a column address, the row address is stored in a row address buffer 13 and sent to the row circuits 11, and the column address is stored in a column address buffer 14 and sent to the column circuits 12. Data transfer between the column circuits 12 and a data buffer 16 is controlled by an input/output control circuit 15, and the data is transferred from/to outside via input/output data terminals (DQ).

A command decoder 17 determines a command for the DRAM based on externally input control signals and sends the command to a control circuit 18. The control circuit 18 controls operations of respective parts of the DRAM according to a command type determined by the command decoder 17. The operation control of the control circuit 18 is performed in conjunction with an internal clock generated by a clock generation circuit (not shown). Further, a mode register 19 selectively sets operation modes of the DRAM based on the above addresses and sends setting information to the control circuit 18.

Figure 3:
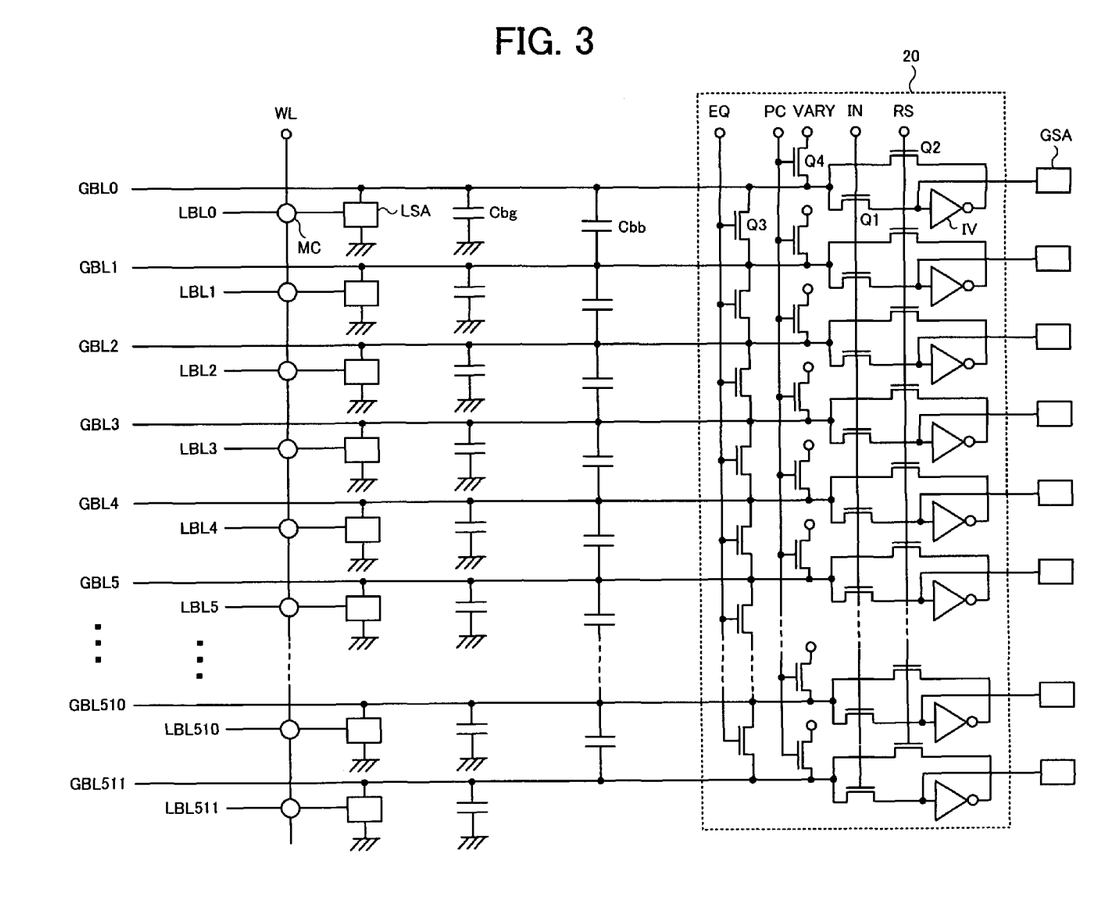
FIG. 3 is a diagram showing a configuration of a memory cell array and its peripheral portion in the DRAM of the embodiment.

Next, FIG. 3 shows a configuration example of the memory cell array 10 and its peripheral portion in the DRAM of FIG. 2. In the example of FIG. 3, 512 global bit line GBL (GBL0 to GBL511) are arranged in the memory cell array 10. Each global bit line GBL is partitioned into N segments in its extending direction, and N local bit lines LBL corresponding to the N segments are arranged. The memory cells MC are formed at all intersections of the local bit lines LBL and the word lines WL, and one end of each local bit line LBL is connected to a local sense amplifier LSA. Each local sense amplifier LSA selectively connects the local bit line LBL to the global bit line GBL in response to a selection signal (not shown). In the example of FIG. 3, one of the plurality of word lines WL is shown and the one word line WL intersects 512 local bit lines LBL (LBL0 to LBL511), but actually there are N×512 local bit lines LBL.

One end of each global bit line GBL is connected to a global sense amplifier GSA via a voltage control circuit 20. The voltage control circuit 20 includes an inverter IV and NMOS type transistors Q1, Q2 and Q4 that are arranged corresponding to each global bit line GBL, and an NMOS type transistor Q3 that is arranged corresponding to adjacent two global bit lines GBL. These elements are repeatedly arranged in an arranging direction of the global bit lines GBL.

The transistor Q1 (the first switch of the invention) controls a connection between the global bit line GBL and an input side of the inverter IV (the inverting circuit of the invention) in response to a capturing signal IN inputted to the gate. The transistor Q2 (the second switch of the invention) controls a connection between the global bit line GBL and an output side of the inverter IV in response to a restore signal RS inputted to the gate. The inverter IV inverts a signal voltage of the global bit line GBL that is transmitted via the transistor Q1. The input side of the inverter IV is connected to the global sense amplifier GSA. The transistor Q4 (the precharge circuit of the invention) precharges the global bit line GBL to a voltage VARY in response to a precharge signal PC inputted to the gate.

The transistor Q3 (the third switch of the invention) controls a connection between adjacent two global bit lines GBL in response to an equalizing signal EQ inputted to the gate. Before a later-described driving operation of the global bit lines GBL, the adjacent global bit lines GBL are short-circuited by setting the equalizing signal EQ to a high level, so that the charge sharing occurs or preferably the lines change to approximately the same potential. In addition, as shown in FIG. 3, there are a coupling capacitance Cbb between the adjacent global bit lines GBL and a fixed capacitance Cbg other than the coupling capacitance respectively as a parasitic capacitance of each global bit line GBL.

In FIG. 3, when the word line WL is selected, a read signal from the memory cell MC is transmitted through the local bit line LBL and amplified by the local sense amplifier LSA, and a corresponding global bit line GEL is driven to a logic state opposite to the read signal. For example, when a high-level signal is read out from the memory cell MC to the local bit line LBL, the global bit line GBL is driven to a low level. Thereafter, the local sense amplifier LSA is disconnected from the global bit line GBL.

The above global sense amplifier GSA senses and latches a signal transmitted through the global bit line GBL via the local sense amplifier LSA. Further, the voltage control circuit 20 captures and inverts the signal latched by the global sense amplifier GSA and drives the global bit line GBL with an opposite logic state. For example, when the high-level signal is read out from the memory cell MC to the local bit line LBL, the global bit line GBL at the low level is inverted and driven to the high level again. Thereafter, the global bit line GBL and the local bit line LBL are connected to each other via the local sense amplifier LSA, and the local bit line LBL is driven to the high level so that the high level is restored to the memory cell MC.

Figure 4:
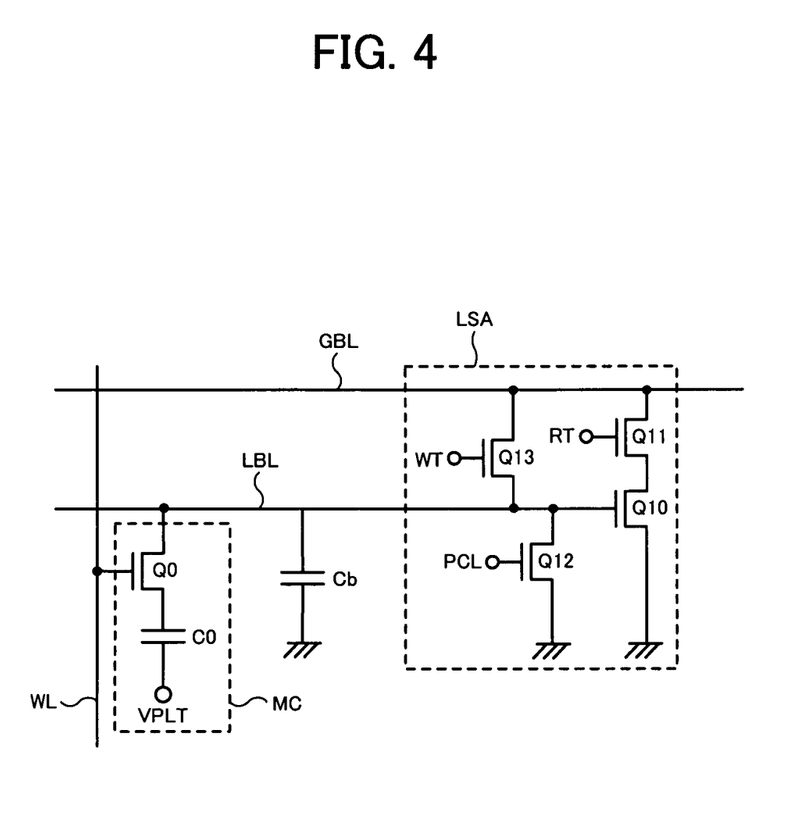
FIG. 4 is a diagram showing a circuit configuration example of a local sense amplifier and a memory cell of FIG. 3.

FIG. 4 shows a circuit configuration of the local sense amplifier LSA and the memory cell MC of FIG. 3. In FIG. 4, the memory cell MC is a destructive reading type memory cell composed of a selection transistor Q0 and a capacitor C0, and the local sense amplifier LSA includes NMOS type transistors Q10, Q11, Q12 and Q13. The selection transistor Q0 of the memory cell MC has a gate connected to the word line WL, a source connected to the local bit line LBL, and a drain connected to one terminal of the capacitor C0. The other terminal of the capacitor C0 is connected to a line of a plate voltage VPLT. Although only one memory cell MC is shown in FIG. 4, actually since the local bit line LBL is connected to a plurality of memory cells MC, and thus there is a parasitic capacitance Cb at each local bit line LBL, as shown in FIG. 4.

In the local sense amplifier LSA, the transistors Q10 and Q11 are connected in series between the global bit line GBL and a ground. The transistor Q10 has a gate connected to the local bit line LBL and amplifies a signal of the local bit line LBL to convert it into a drain current. The transistor Q11 switches a connection between the drain of the transistor Q10 and the global bit line GBL in response to a control signal RT inputted to the gate. The transistor Q12 precharges the local bit line LBL to a ground potential in response to a precharge signal PCL inputted to the gate. The transistor Q13 switches a connection between the local bit line LBL and the global bit line GBL in response to a control signal WT inputted to the gate. Thus, the voltage amplitude of the signal of the local bit line LBL corresponding to stored data that is read out from the memory cell MC to the local bit line LBL is smaller than that of a signal of the global bit line GBL that is amplified by the transistor Q10. Further, the voltage amplitude is also smaller than that of a signal having an opposite logic inverted and driven by the global sense amplifier GSA, which is transmitted to the memory cell MC via the transistor Q13 and the local bit line LBL. In addition, various circuit configurations can be used to configure the local sense amplifier LSA without being limited to the circuit configuration shown in FIG. 4.

Figure 5:
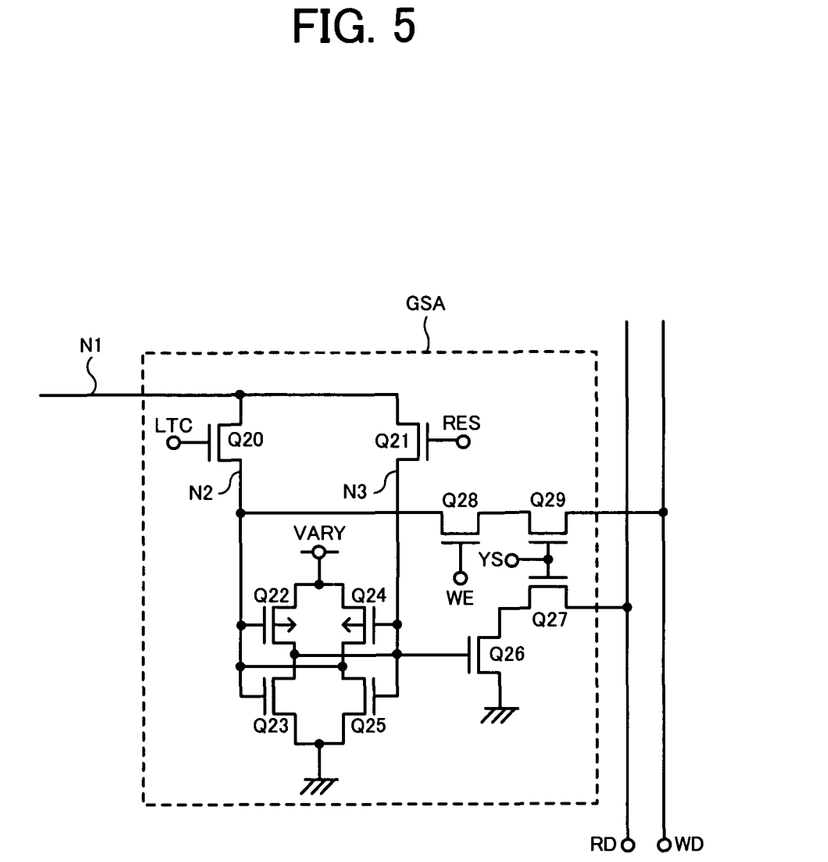
FIG. 5 is a circuit configuration example of a global sense amplifier.

FIG. 5 shows a circuit configuration example of the global sense amplifier GSA of FIG. 3. In FIG. 5, the global sense amplifier GSA includes PMOS type transistors Q22, Q24 and NMOS type transistors Q20, Q21, Q23, Q25, Q26, Q27, Q28 and Q29. The transistor Q20 controls a connection between nodes N1 and N2 in response to a control signal LTC inputted to the gate, and the transistor Q21 controls a connection between nodes N1 and N3 in response to a control signal RES inputted to the gate. The transistors Q22 to Q25 form a latch circuit, in which gates of a pair of transistors Q22 and Q23 forming a sensing inverter are connected to the node N2 and a pair of transistors Q24 and Q25 forming a latching inverter are connected to the node N3. These two inverters are cross-coupled to each other at their inputs and outputs, and the voltage VARY and the ground potential are supplied to the inverters.

The global sense amplifier GSA is connected to a read signal line RD and a write signal line WD via the transistors Q26, Q27, Q28 and Q29. The transistors Q26 and Q27 are connected in series between the read signal line RD and the ground potential, and the transistors Q28 and Q29 are connected in series between the node N2 and the write signal line WD. The gate of the transistor Q26 is connected to the node N3, a control signal WE is inputted to the gate of the transistor Q28, and a selection signal YS is commonly inputted to gates of the transistors Q27 and Q29. in a read operation, the control signal LTC is set to a high level, the control signal RES is set to a low level, the control signal WE is set to a low level, the selection signal YS is set to a high level, and an output signal of the node N3 is outputted to the read signal line RD via the transistors Q26 and Q27. In a write operation, the selection signal YS is set to a high level, the control signal LTC is set to a low level, the control signal RES is set to a high level, the control signal WE is set to a high level, and write data received from the write signal line WD is inverted by the above sensing inverter via the transistors Q29 and Q28 and is outputted to the node N1 via the transistor Q21.

Figure 6:
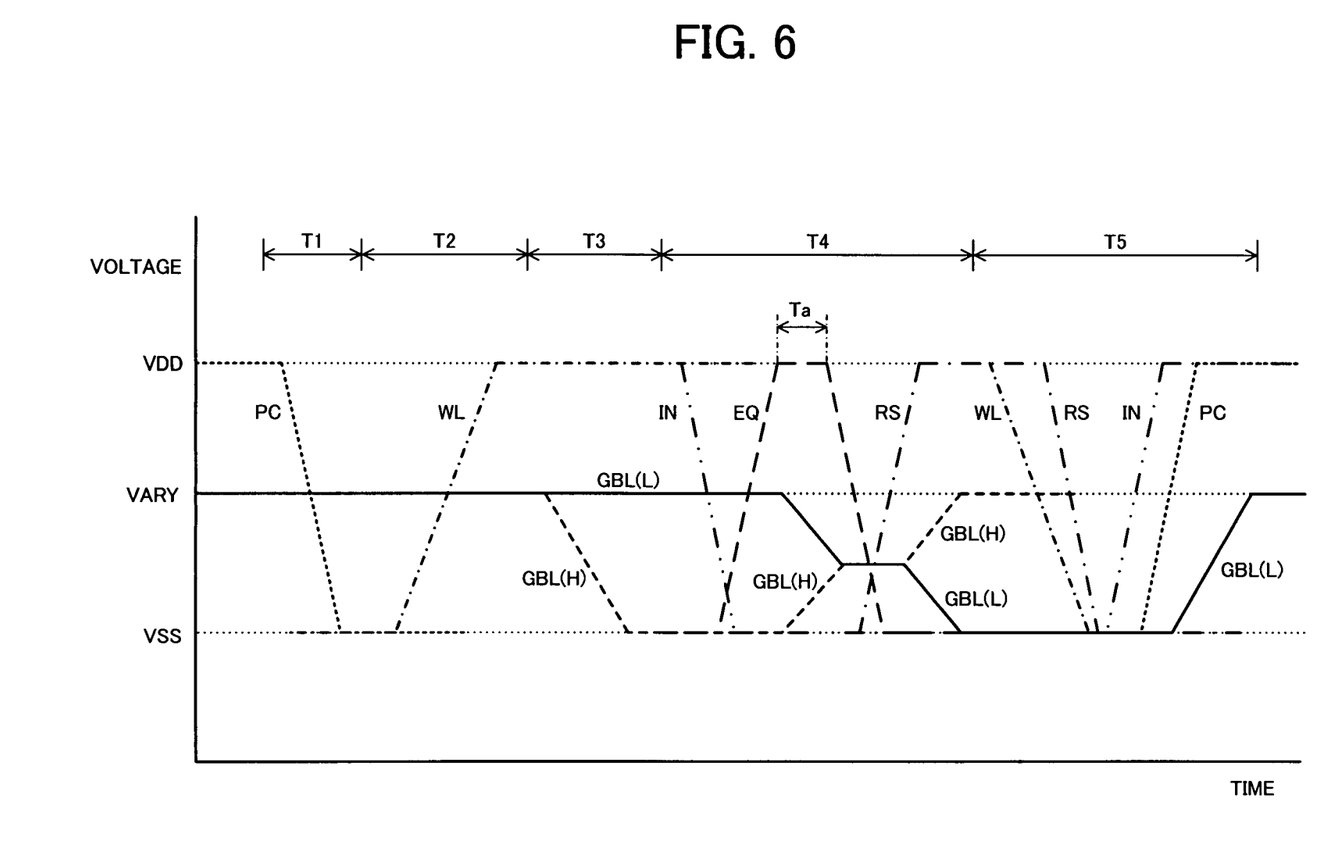
FIG. 6 is a diagram showing operation waveforms in a read operation of the memory cell array of FIG. 3.

Next, the read/restore operation of the memory cell array 10 of the embodiment will be described with reference to FIGS. 6 to 9. FIG. 6 shows operation waveforms of the read/restore operation through a predetermined global bit line GBL in the memory cell array 10 of FIG. 3. In addition, the precharge signal PC, the word line WL, the capturing signal IN, the equalizing signal EQ, the restore signal RS shown in FIG. 6 have a high level at a power supply voltage VDD and a low level at a ground potential VSS. First, in an early period (before a precharge cancel period T1), the precharge signal PC is at the high level, and the global bit line GBL has been precharged to the voltage VARY. During the precharge cancel period T1, the precharge signal PC is changed to the low level, and the global bit line GBL maintaining the voltage VARY is brought into a floating state.

Next, during a memory cell selection period T2, the word line WL is driven to the power supply voltage VDD from the ground potential VSS, and a signal corresponding to stored data of the memory cell MC is read out to the local bit line LBL (the waveform of the local bit line LBL is not shown). Subsequently, during an amplification period T3, the global bit line GBL is driven to a logic state opposite to the signal transmitted from the memory cell MC to the local bit line LBL, and the global sense amplifier GSA senses and latches the signal of the global bit line GBL. As shown in FIG. 6, the global bit line GBL(L) corresponding to the low-level read signal is maintained at the voltage VARY (represented as a solid line), and the global bit line GBL(H) corresponding to the high-level read signal is maintained at the ground potential VSS (represented as a dashed line).

Next, during a driving period T4, the capturing signal IN is changed from the high level to the low level. At this point, since the restore signal RS is in a low-level state, both the transistors Q1 and Q2 are turned off so that the global bit line GBL is brought into a floating state. Subsequently, when the equalizing control is performed by setting the equalizing signal EQ to the high level within a predetermined period Ta, the transistor Q3 is turned on so that charge sharing of the adjacent global bit lines GBL occurs or they preferably change to approximately the same potential. Here, if global bit lines GBL of high and low levels are adjacent to each other, the electric charge transfers therebetween. For example, if the global bit lines GBL (L) and GBL (H) shown in FIG. 6 are adjacent to each other, since the electric charge thereof transfers via the transistor Q3, both the potentials of the global bit lines GBL(L) and GBL(H) transitions to an intermediate value between the voltage VARY and the ground potential VSS.

Thereafter, the restore signal RS is changed to the high level so that the transistor Q2 is turned on, and the global bit line GBL is inverted and driven by the inverter IV. For example, as shown in FIG. 6, the global bit line GBL(L) is inverted and driven from the above intermediate value to the ground potential VSS, and the global bit line GBL(H) is inverted and driven from the above intermediate value to the voltage VARY. Here, since the global bit line GBL and the local bit line LBL are connected to each other via the local sense amplifier LSA, the inverted data of the global bit line GBL is transmitted to the local bit line LBL and is restored to the memory cell MC. Subsequently, during a precharge start period T5, the word line WL and the restore signal RS are changed to the low level, and then the capturing signal IN and the precharge signal PC are changed to the high level. Thereby, the global bit line GBL is precharged to the voltage VARY again, and a series of the read/restore operations completes.

According to the above description and figures, following matters can be clearly understood. That is, the signal transmitted from the memory cell MC to the corresponding local bit line LBL has a logic level opposite to that of the signal transmitted to the corresponding global bit line GBL through the local bit line LBL. Further, the signal transmitted to the global bit line GBL through the local bit line LBL has a logic level opposite to that of the signal transmitted to the global bit line GBL from the voltage control circuit 20 (the inverting circuit) that inverts and drives the signal. Furthermore, the signal transmitted from the voltage control circuit 20 to the corresponding global bit line GBL has the same logic level as that of the signal transmitted from the global bit line GBL to the corresponding local bit line LBL via the local sense amplifier LSA. These are included in features of a so-called single-ended sense amplifier and its structure.

Figure 7:
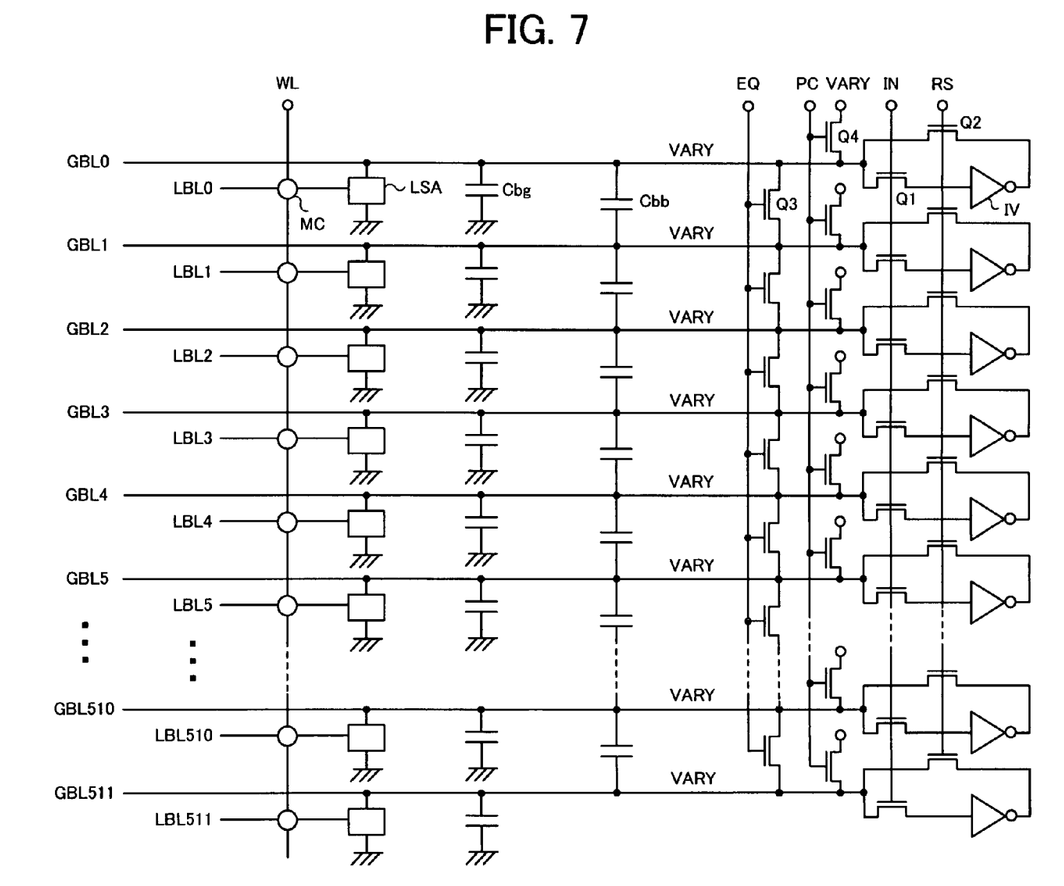
FIG. 7 is a diagram showing a first potential state of global bit lines assumed at an end of an amplification period T3 in the memory cell array of FIG. 3.
Figure 8:
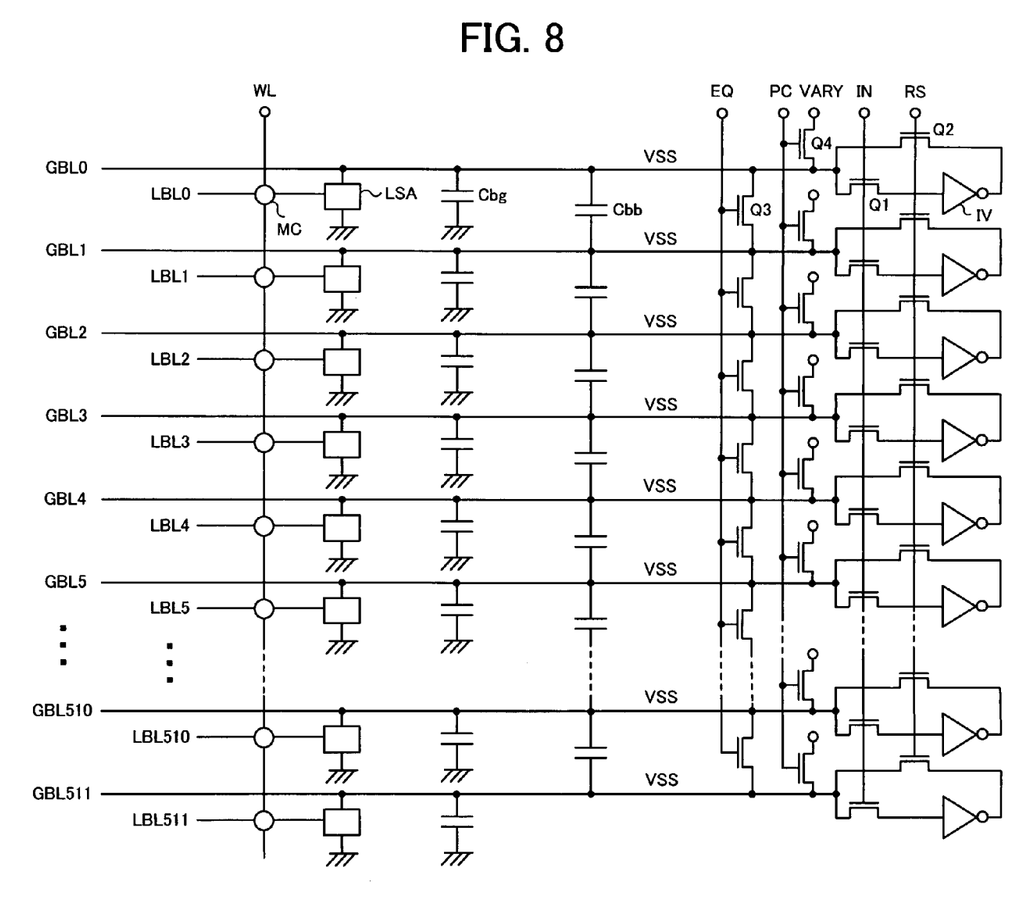
FIG. 8 is a diagram showing a second potential state of the global bit lines assumed at the end of the amplification period T3 in the memory cell array of FIG. 3.
Figure 9:
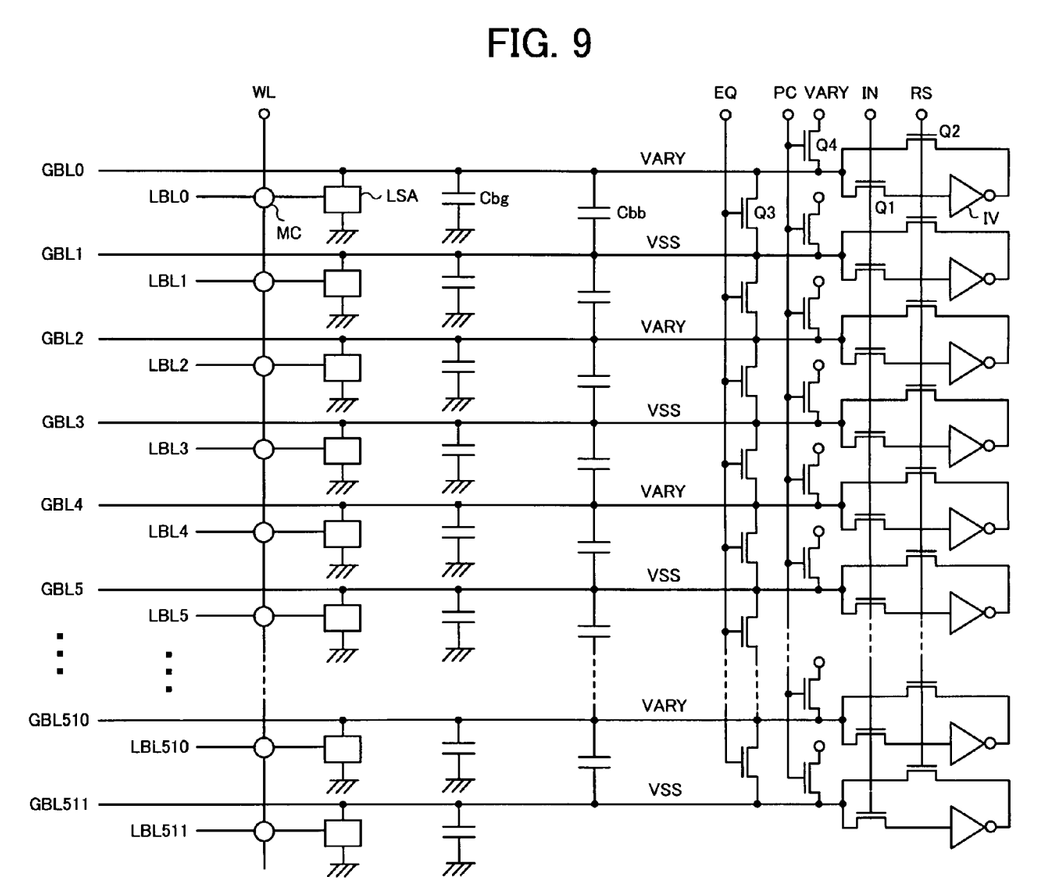
FIG. 9 is a diagram showing a third potential state of the global bit lines assumed at the end of the amplification period T3 in the memory cell array of FIG. 3.

FIGS. 7 to 9 shows examples of three types of potential states of the global bit lines GBL that is assumed at the end of the amplification period T3 of FIG. 6 in the memory cell array 10 of FIG. 3. In a first potential state shown in FIG. 7, all global bit lines GBL of the memory cell array 10 are maintained at the voltage VARY at the end of the amplification period T3. In this state, the electric charge is not transferred between adjacent global bit lines GBL within the predetermined period Ta (During which each transistor Q3 is turned on) of the driving period T4, and thus the potential of each global bit line GBL does not change. Thereafter, when inverting and driving the global bit lines GBL, the coupling capacitance Cbb of the parasitic capacitance at each global bit line GBL is too small to serve as a wiring load. Therefore, since the parasitic capacitance of each global bit line GBL only includes the above fixed capacitance Cbg, the consumption current in the driving operation is only required for driving the fixed capacitance Cbg.

In a second potential state shown in FIG. 8, all global bit lines GBL of the memory cell array 10 are maintained at the ground potential VSS at the end of the amplification period T3. In this state, the electric charge is not transferred between adjacent global bit lines GBL within the predetermined period Ta of the driving period T4, and thus the potential of each global bit line GBL does not change, similarly as in FIG. 7. Thereafter, when inverting and driving the global bit lines GBL, the above-mentioned coupling capacitance Cbb is too small to serve as the wiring load, similarly as in FIG. 7, and also in this case, the consumption current in the driving operation is only required for driving the fixed capacitance Cbg.

Meanwhile, in a third potential state shown in FIG. 9, the global bit lines GBL of the memory cell array 10 are alternately maintained at the voltage VARY and the ground potential VSS at the end of the amplification period T3. That is, two global bit lines GBL being adjacent in the memory cell array 10 are in a state of having potentials opposite to each other. If the global bit lines GBL are driven in this state, the coupling capacitance Cbb included in the parasitic capacitance of each of all the global bit lines GBL serves as the wiring load, and thus maximum consumption current is required for driving the global bit lines GBL with which the fixed capacitances Cbg thereof are driven. In order to avoid such a state, the embodiment performs the equalizing control during the driving period T4 so that the electric charge is transferred between the fixed capacitances Cbg of the adjacent global bit lines GBL. Thereby, since the driving operation of all the global bit lines GBL is performed in a state where they transition to the intermediate voltage between the voltage VARY and the ground potential VSS, the consumption current required at this time can be reduced by about 50 percent of that for the fixed capacitance Cbg.

Next, the reduction effect of consumption current in the read operation of the memory cell array 10 of the embodiment will be described with reference to FIGS. 10 and 11. Hereinafter, a ratio of combinations of adjacent global bit lines GBL transmitting data of logics opposite to each other (One of which is at the high level and the other of which is at the low level) among combinations of the adjacent global bit lines GEL in the memory cell array 10 is defined as "adjacent GBL opposite data ratio (%)". For example, if M global bit lines GBL are arranged in the memory cell array 10, there are M-1 pairs of the adjacent global bit lines GBL. In this state, when all of the global bit lines GBL transmit data having the same logic, the adjacent GBL opposite data ratio is 0 percent, and when the global bit lines GBL transmitting the data of high and low levels are alternately arranged, the adjacent GEL opposite data ratio is 100 percent.

Figure 10A:
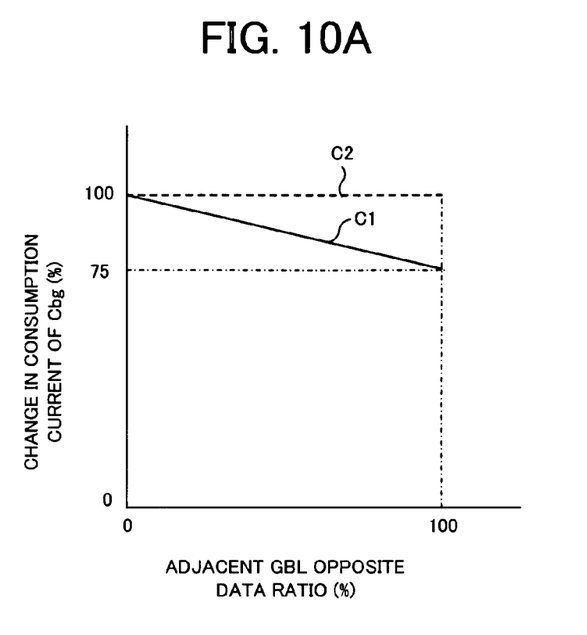
FIGS. 10A and 10B are first diagrams explaining a reduction effect of consumption current in the memory cell array of the embodiment.
Figure 11A:
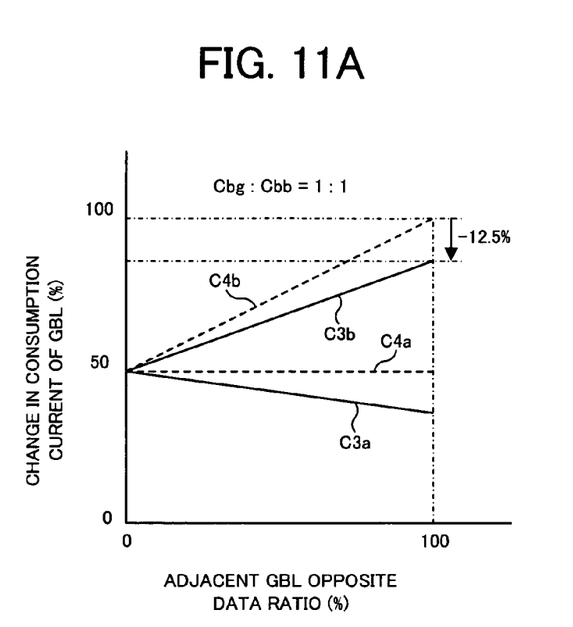
FIGS. 11A and 11B are second diagrams explaining the reduction effect of consumption current in the memory cell array of the embodiment.

FIG. 10A schematically shows a dependence on the above adjacent GBL opposite data ratio regarding a change in consumption current due to the fixed capacitance Cbg of the memory cell array 10. In FIG. 10A, a characteristic C1 (solid line) is for a case of performing the control of the embodiment during the driving period T4 of FIG. 6, a characteristic C2 (dashed line) is for a case of not performing the control using the transistor Q3 of the embodiment for comparison. First, in the case of the characteristic C2, the consumption current due to the fixed capacitance Cbg is uniform within a range of the adjacent GBL opposite data ratio from 0 percent (for example, a state of FIG. 7 or 8) to 100 percent (for example, a state of FIG. 9), and this current value is used as a reference value (100 percent). On the other hand, in the case of the characteristic C1 corresponding to the embodiment, the current value where the adjacent GBL opposite data ratio is 0 percent is equal to that of the characteristic C2, and as the adjacent GBL opposite data ratio increases, the consumption current due to the fixed capacitance Cbg decreases. Then, when the adjacent GBL opposite data ratio reaches 100 percent, the reduction effect of the consumption current based on the above charge transfer can be obtained in half of one read cycle of the charge/discharge current, and therefore the consumption current due to the fixed capacitance Cbg reaches 75 percent so that a reduction effect of 25 percent can be obtained.

Figure 10B:
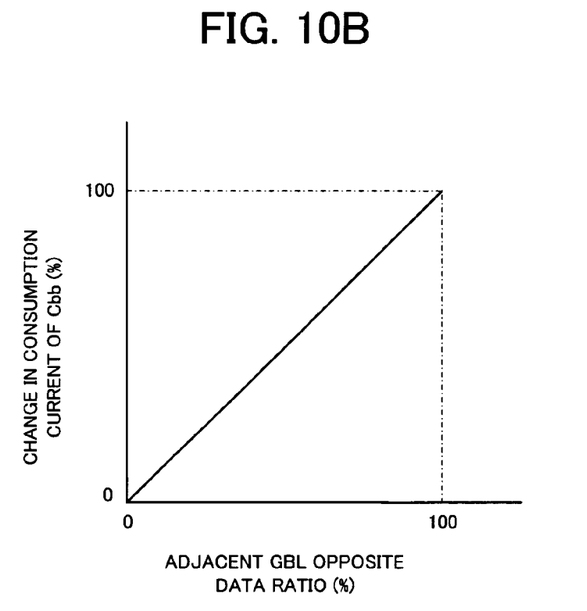

Further, FIG. 10B schematically shows a dependence on the above adjacent GBL opposite data ratio regarding a change in consumption current due to the coupling capacitance Cbb of the memory cell array 10. As shown in a characteristic (solid line) of FIG. 10B, the consumption current due to the coupling capacitance Cbb uniformly increases within the range of the adjacent GBL opposite data ratio from 0 percent to 100 percent, regardless of whether or not the control of the embodiment is performed during the driving period T4. As described above, when the adjacent global bit lines GBL transmit data having the same logic, the consumption current due to the coupling capacitance Cbb becomes zero.

Next, a dependence on the above adjacent GBL opposite data ratio regarding a contribution ratio of the fixed capacitance Cbg and the coupling capacitance Cbb of the consumption current of the global bit lines GBL will be described. FIG. 11A schematically shows a dependence on the adjacent GBL opposite data ratio when the contribution ratio of the fixed capacitance Cbg and the coupling capacitance Cbb is 1:1. A characteristic C3a (solid line) corresponds to the characteristic C1 of FIG. 10A in which the control of the embodiment is performed, and a characteristic C3b (solid line) is obtained by adding the characteristic of FIG. 10B to the characteristic C3a. In contrast, a characteristic C4a (dashed line) corresponds to the characteristic C2 of FIG. 10A in which the control of the embodiment is not performed, and a characteristic C4b (dashed line) is obtained by adding the characteristic of FIG. 10B to the characteristic C4a. As apparent from FIG. 11A, the consumption current reaches the maximum when the adjacent GBL opposite data ratio is 100 percent, and by performing the control of the embodiment at this time, a reduction effect of consumption current of about 12.5 percent can be obtained.

Figure 11B:
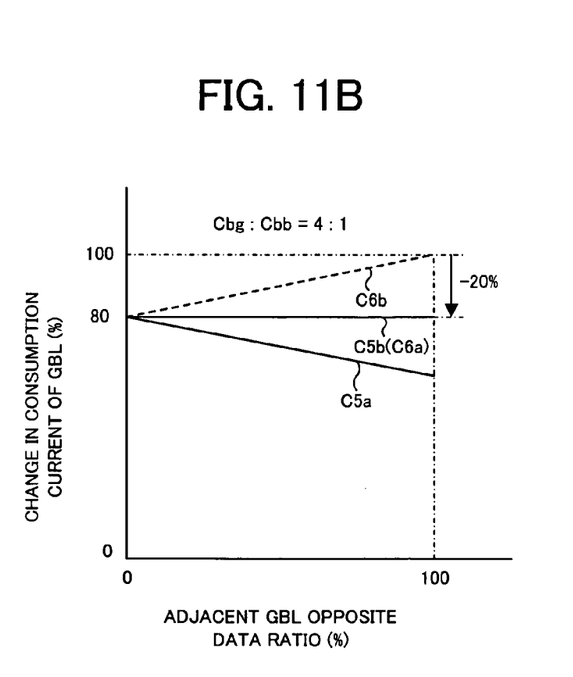

Further, FIG. 11B schematically shows a dependence on the adjacent GBL opposite data ratio when the contribution ratio of the fixed capacitance Cbg and the coupling capacitance Cbb is 4:1. A characteristic C5a (solid line) corresponds to the characteristic C1 of FIG. 10A in which the control of the embodiment is performed, and a characteristic C5b (solid line) is obtained by adding the characteristic of FIG. 10B to the characteristic C5a. In contrast, a characteristic C6a (dashed line) overlapping the characteristic C5b corresponds to the characteristic C2 of FIG. 10A in which the control of the embodiment is not performed, and a characteristic C6b (dashed line) is obtained by adding the characteristic of FIG. 10B to the characteristic C6a. As apparent from FIG. 11B, in the characteristic C5b that changes flatly, the dependence on the adjacent GBL opposite data ratio is lost and a reduction effect of consumption current of about 20 percent can be obtained when the adjacent GBL opposite data ratio is 100 percent. As described above, in the control of the embodiment, the maximum reduction effect of consumption current can be obtained when the contribution ratio of the fixed capacitance Cbg and the coupling capacitance Cbb is 4:1 in the consumption current.

[Data Processing System]

Figure 12:
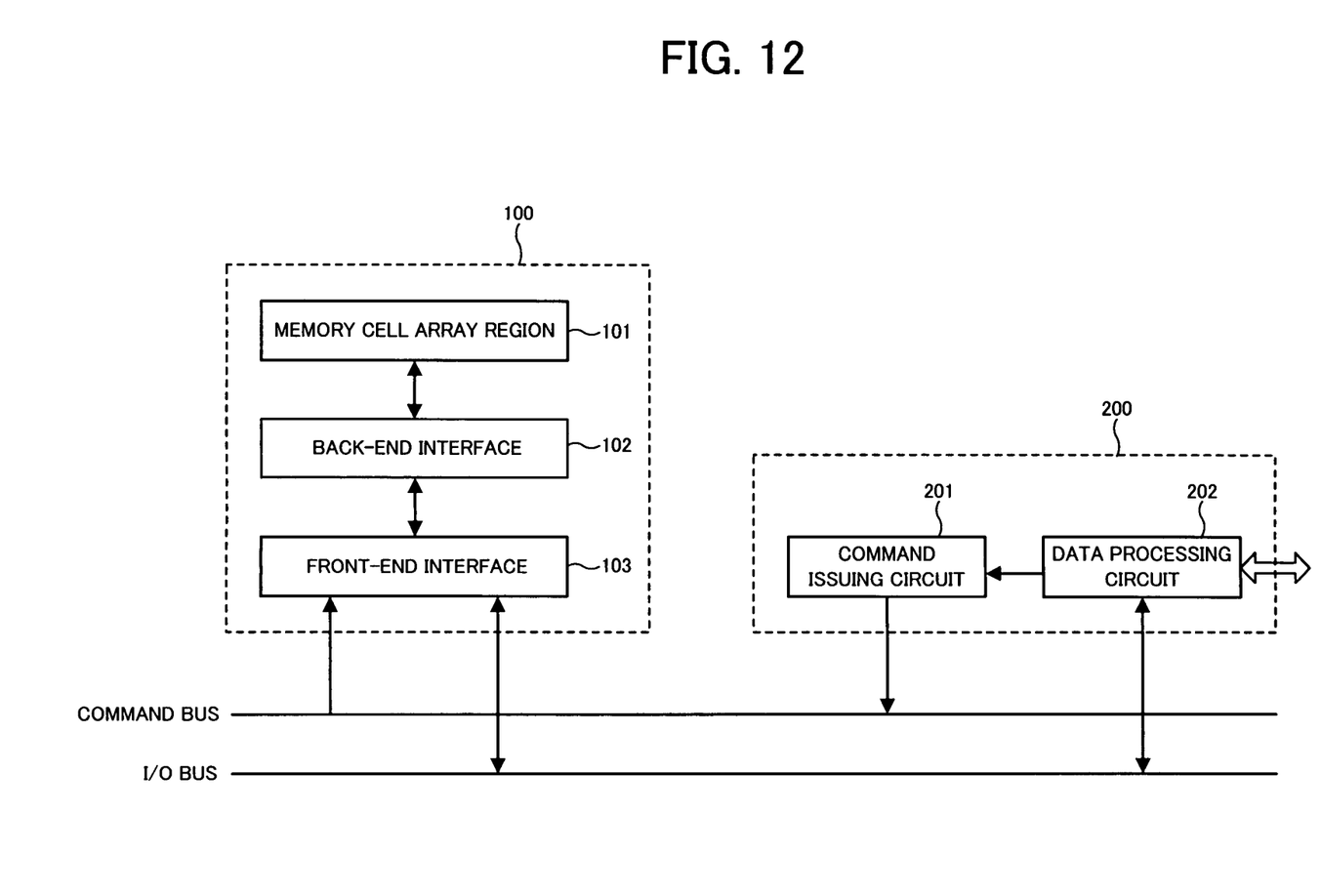
FIG. 12 is a diagram showing a configuration example of a data processing system comprising a semiconductor device having the configuration described in the embodiments and a controller controlling operations of the semiconductor device.

Next, a case in which the present invention is applied to a data processing system comprising a semiconductor device will be described. FIG. 12 shows a configuration example of the data processing system comprising a semiconductor device 100 having the configuration described in the embodiments and a controller 200 controlling operations of the semiconductor device 100.

The semiconductor device 100 is provided with a memory cell array 101, a back-end interface 102 and a front-end interface 103. The memory cell array 101 includes the memory cell array 10 of the above embodiments. The back-end interface 102 includes peripheral circuits of the memory cell array 10. The front-end interface 103 has a function to communicate with the controller 200 through a command bus and an I/O bus. Although FIG. 12 shows only one semiconductor device 100, a plurality of semiconductor devices 100 may be provided in the system.

The controller 200 is provided with a command issuing circuit 201 and a data processing circuit 202, and controls operations of the system as a whole and the operation of the semiconductor device 100. The controller 200 is connected with the command bus and the I/O bus, and additionally has an interface for external connection. The command issuing circuit 201 sends commands to the semiconductor device 100 through the command bus. The data processing circuit 202 sends and receives data to and from the semiconductor device 100 through the I/O bus and performs processes required for the controlling. In addition, the semiconductor device 100 of the embodiments may be included in the controller 200 in FIG. 12.

The data processing system of FIG. 12 is, for example, a system implemented in electronics devices such as personal computers, communication electronics devices, mobile electronics devices and other industrial/consumer electronics devices.

In the foregoing, the preferred embodiments of the present invention have been described. However the present invention is not limited to the above embodiments and can variously be modified without departing the essentials of the present invention. For example, the present invention can be applied to a memory device having transmission lines of data signals, a data processor and the like. Further, various circuit configurations can be employed for the local sense amplifier LSA, the global sense amplifier GSA and the like without being limited to the configurations described in the embodiments.

The present invention is not limited to the DRAM disclosed in the embodiments, and can be applied to various semiconductor devices such as CPU (Central Processing Unit), MCU (Micro Control Unit), DSP (Digital Signal Processor), ASIC (Application Specific Integrated Circuit), ASSP (Application Specific Standard Product) and the like. Further, the present invention can be applied to various devices such as SOC (System on Chip), MCP (Multi Chip Package) and POP (Package on Package) and the like.

Further, transistors of the present invention are field-effect transistors (FETs) including various transistors such as not only MOS (Metal Oxide Semiconductor) transistors but also MIS (Metal-Insulator Semiconductor) transistors, TFT (Thin Film Transistor) and the like. Further, the device of the invention may include bipolar transistors. Furthermore, an N-channel type transistor (NMOS transistors) is a typical example of a first conductive type transistor, and a P-channel type transistor (PMOS transistor) is a typical example of a second conductive type transistor.

The present invention can be applied to devices based on various combinations or selections of the disclosure of the embodiments. That is, the present invention covers various modifications which those skilled in the art can carry out in accordance with all disclosures including claims and technical ideas.

The invention claimed is:

1. A device comprising:
a plurality of first lines;
a plurality of memory cells each connected to an associated one of the first lines; a plurality of second lines;
a plurality of first switches each electrically connected between an associated one of the first lines and an associated one of the second lines;
a plurality of first sense amplifiers each electrically connected to an associated one of the second lines;
a plurality of second switches each connected between associated two ofthe second lines that are adjacent to each other;
a plurality of third switches each inserted between an associated one of the second lines and an associated one of the first sense amplifiers; and
a plurality of inverting amplifiers each connected to an associated one of the second lines through an associated one of the third switches and a plurality of fourth switches each connected between an associated one of the inverting amplifiers and an associated one of the second lines.

2. The device according to claim 1, further comprising a plurality of second sense amplifiers each connected to an associated one of the first lines, each of the first switches being connected between an associated one of the second sense amplifiers and an associated one of the second lines.

3. The device according to claim 1, wherein the first switches are controlled in common by a first control signal and the second switches are controlled in common by a second control signal.

4. The device according to claim 3, wherein each of the second switches is turned ON by the second control signal prior to driving each of the second lines with a voltage that is used to restore a data signal into an associated one of the memory cells.

5. A device comprising:
a plurality of first lines;
a plurality of memory cells each connected to an associated one of the first lines; a plurality of second lines;
a plurality of first switches each electrically connected between an associated one of the first lines and an associated one of the second lines;
a plurality of first sense amplifiers each electrically connected to an associated one of the second lines;
a plurality of second switches each connected between associated two ofthe second lines that are adjacent to each other; and
a plurality of second sense amplifiers each provided for an associated one of the first lines, each of the second sense amplifiers including an associated one of the first switches,
wherein each of the second sense amplifiers includes a first transistor including a gate electrically coupled to an associated one of the first lines and a third switch coupled between the first transistor and an associated one of the second lines.

6. The device according to claim 5, wherein the first switches are controlled in common by a first control signal, the second switches are controlled in common by a second control signal, and the third switches are controlled in common by a third control signal.

7. The device according to claim 6, wherein each of the second switches is turned ON by the third control signal after each of the third switches is changed from an ON state to an OFF state by the third control signal, and each of the first switches is turned ON by the first control signal after each of the second switches is changed from an ON state to an OFF state by the second control signal.

8. The device according to claim 7, wherein each of the memory cells comprises a cell transistor and a cell capacitor connected in series with each other between an associated one of the first lines and a cell plate voltage line.

9. A device comprising: at least one word line;
a plurality of local bit lines each intersecting the at least one word line;
a plurality of memory cells each connected to the at least one word line and an associated one of the local bit lines;
a plurality of global bit lines;
a plurality of local sense amplifiers each coupled between an associated one of the local bit lines and an associated one of the global bit lines;
a plurality of global sense amplifiers each operatively coupled to an associated one of the global bit lines;
a plurality of first switches coupled between associated two of the global bit lines that are adjacent to each other;

a plurality of second switches each inserted between an associated one of the global bit lines and an associated one of the global sense amplifiers; and a plurality of inverting amplifiers each connected to an associated one of the global bit lines through an associated one of the second switches and a plurality of third switches each connected between an associated one of the inverting amplifiers and an associated one of the global bit lines.

10. The device according to claim 9, wherein each of the local sense amplifiers comprises:

a transistor configured to receive at a gate thereof a voltage level responsive to data stored in a corresponding one of the memory cells; and a third switch coupled in series with the transistor between an associated one of the global bit lines and a voltage line.

11. The device according to claim 10, wherein each of the second and third switches is turned ON with turning each of the first switches OFF, and each of the first switches is turned ON with turning each of the second and third switches OFF.

12. The device according to claim 11, wherein each of the local sense amplifiers further comprises a fourth switch coupled between an associated one of the global bit lines and an associated one of the local bit lines, the fourth switch being turned ON with turning each of the first, second and third switches OFF.

* * * * *